United States Patent
Paydar et al.

(10) Patent No.: US 7,248,475 B2
(45) Date of Patent: Jul. 24, 2007

(54) WIRELESS DEVICE ENCLOSURE USING PIEZOELECTRIC COOLING STRUCTURES

(75) Inventors: Reza Paydar, Chandler, AZ (US); Ioan Sauciuc, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 102 days.

(21) Appl. No.: 11/140,769

(22) Filed: May 31, 2005

(65) Prior Publication Data

US 2006/0268534 A1 Nov. 30, 2006

(51) Int. Cl.
*H05K 7/20* (2006.01)

(52) U.S. Cl. ............ 361/695; 361/697; 165/80.3; 165/104.33; 165/122; 454/184; 310/330

(58) Field of Classification Search ......... 361/678, 361/679, 690–697, 687, 699; 165/80.3, 122, 165/104.33, 104.34; 454/184–186; 257/712–727; 312/236, 223.1, 223.2, 223.3; 310/311–371; 417/410.1, 436
See application file for complete search history.

(56) References Cited

U.S. PATENT DOCUMENTS

| 4,923,000 | A  | * | 5/1990 | Nelson ................ 165/122 |
| 5,861,703 | A  | * | 1/1999 | Losinski .............. 310/330 |
| 6,938,678 | B1 | * | 9/2005 | Bortolini et al. ....... 165/80.4 |
| 7,023,697 | B2 | * | 4/2006 | Pokharna et al. ....... 361/695 |
| 7,031,155 | B2 | * | 4/2006 | Sauciuc et al. ........ 361/695 |
| 2004/0253130 | A1 | * | 12/2004 | Sauciuc et al. ...... 417/436 |
| 2005/0231914 | A1 | * | 10/2005 | Mikubo et al. ....... 361/699 |
| 2006/0139882 | A1 | * | 6/2006 | Mikubo et al. ....... 361/699 |

* cited by examiner

*Primary Examiner*—Michael Datskovskiy
(74) *Attorney, Agent, or Firm*—The Law Offices of John C. Scott, LLC

(57) ABSTRACT

An enclosure for a wireless device includes a first compartment and a second compartment. The first compartment is to house some or all of the electronic circuitry of the wireless device and is sealed from an exterior environment. The second compartment is adjacent to the first compartment and includes one or more piezoelectric fans to provide cooling for the first compartment. The second compartment is open to the exterior environment and provides physical protection for the one or more piezoelectric fans located therein.

19 Claims, 4 Drawing Sheets

WIRELESS DEVICE ENCLOSURE USING PIEZOELECTRIC COOLING STRUCTURES

TECHNICAL FIELD

The invention relates generally to wireless communications and, more particularly, to circuit cooling techniques for use within wireless devices.

BACKGROUND OF THE INVENTION

The functional complexity of wireless chips and other processing circuitry within wireless devices is increasing. Such increases in functional complexity typically result in corresponding increases in heat generation (power dissipation) within the wireless devices. As heat generation increases, a point may eventually be reached where natural convention is no longer adequate to maintain the circuitry at an acceptable operating temperature. For this reason, thermal solutions may be developed to facilitate the removal of heat from the circuitry within a wireless device. As space is often limited within portable wireless devices, thermal solutions for use in such devices should be capable of implementation within relatively tight areas. In addition, the power consumption of the thermal solutions themselves should be considered. This is because wireless devices are often battery powered and, therefore, any decrease in the amount of power consumed by the thermal solution will increase the operational lifetime of the wireless device between battery recharges/replacements. In addition, any additional thermal energy added to the inner region of a wireless device by power dissipation within the thermal solution may reduce the overall effectiveness of the thermal solution.

DETAILED DESCRIPTION

Figure 1:
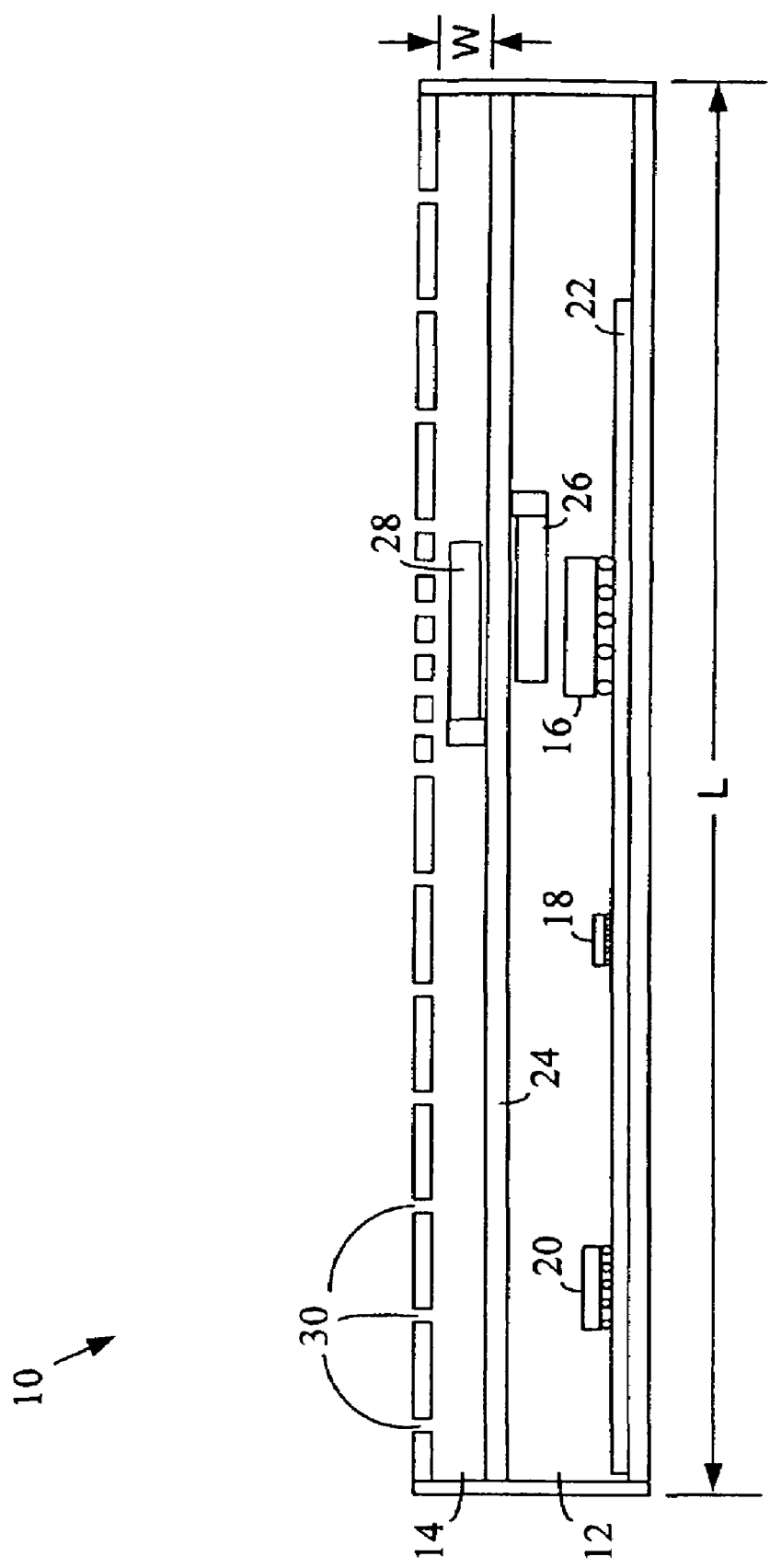
FIG. 1 is a sectional side view of an exemplary wireless device in accordance with an embodiment of the present invention.

In the following detailed description, reference is made to the accompanying drawings that show, by way of illustration, specific embodiments in which the invention may be practiced. These embodiments are described in sufficient detail to enable those skilled in the art to practice the invention. It is to be understood that the various embodiments of the invention, although different, are not necessarily mutually exclusive. For example, a particular feature, structure, or characteristic described herein in connection with one embodiment may be implemented within other embodiments without departing from the spirit and scope of the invention. In addition, it is to be understood that the location or arrangement of individual elements within each disclosed embodiment may be modified without departing from the spirit and scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout the several views.

FIG. 1 is a sectional side view of an exemplary wireless device 10 in accordance with an embodiment of the present invention. The wireless device 10 may be any form of device that is capable of wirelessly communicating with a remote wireless entity including, for example, a cellular telephone, a personal digital assistant (PDA) having wireless networking capability, a portable computer (e.g., laptop, palmtop, tablet, etc.) having wireless networking capability, a satellite communicator, a camera having wireless capability, an audio/video device having wireless capability, a wireless network interface card or other wireless network interface structure, and/or some other type of device. As shown, the wireless device 10 includes a first compartment 12 and a second compartment 14. The first compartment 12 houses some or all of the electronics of the wireless device 10. As will be described in greater detail, the second compartment 14 may be used to facilitate the removal of heat from the first compartment 12.

As shown in FIG. 1, the first compartment 12 may house one or more integrated circuits 16, 18, 20 mounted on a printed circuit board 22. The integrated circuits may include one or more programmable and/or reconfigurable digital processing devices such as, for example, a general purpose microprocessor, a digital signal processor (DSP), a reduced instruction set computer (RISC), a complex instruction set computer (CISC), a field programmable gate array (FPGA), an application specific integrated circuit (ASIC), and/or others. The integrated circuits within the first compartment 12 may also include one or more radio frequency (RF) devices such as, for example, an RF transmitter, an RF receiver, an RF transceiver, and/or other RF circuitry. Other electronic components and circuits may also be located within the first compartment 12. During normal device operation, at least some of the various circuit structures within the first compartment 12 will generate heat. The more heat that is produced by these circuits, the higher the temperature that the circuitry within the first compartment 12 will reach. At some point, temperatures may be reached that can seriously degrade the performance of the circuit structures and that may result in permanent damage to the structures.

The circuit elements within the first compartment 12 may be sensitive to one or more environmental conditions in a region surrounding the wireless device 10. For example, dust and/or other contaminants in the surrounding environment, if permitted to enter the first compartment 12, may have a negative impact on the performance of one or more of the circuit structures within the first compartment 12. Moisture in the surrounding environment may also negatively impact the performance of one or more elements within the first compartment 12 if allowed to enter. For this reason, the first compartment 12 may be sealed from the exterior environment to prevent the entry of moisture and other substances that may be harmful to the circuitry. Because the first compartment 12 is sealed, however, it may be more difficult to remove any built up heat within the first compartment 12 to reduce the temperature of the circuit elements therein. In at least one embodiment of the present invention, techniques and structures are provided for cooling electronic elements within a sealed compartment of a wireless device (such as first compartment 12).

As shown in FIG. 1, in the illustrated embodiment, at least one piezoelectric fan 26 is mounted within the first compartment 12 of the wireless device 10 to cool the circuitry therein. The piezoelectric fan 26 includes a piezoelectric element having a blade attached thereto. An alternating current (AC) signal is applied to the piezoelectric element during device operation to activate the piezoelectric fan 26. The AC signal causes the piezoelectric element to deform in a repetitive manner which, in turn, moves the blade in an oscillatory fashion. The oscillating blade then causes air to flow within the first compartment 12 in a manner similar to a Chinese fan. Even though the first compartment 12 is sealed, the movement of the air within the first compartment 12 by the piezoelectric fan 26 will tend to remove heat from the hotter electronic elements and into the unoccupied space within the first compartment 12. In this manner, junction temperatures within the electronic components may be reduced and performance increased. This may also allow higher power levels to be used within a wireless device to achieve, for example, greater digital processing power, higher transmit power levels, etc.

Piezoelectric fans are relatively low power devices. For example, some piezoelectric fans can operate at one tenth the power level (or less) of conventional rotary fans that move an equal volume of air. Piezoelectric fans are also relatively low profile devices that may be used in tight areas where conventional fans will not fit. In addition, piezoelectric fans can be easily modified to fit within spaces having non-standard shapes by appropriately shaping the blade element of the fan. These blade elements may be fabricated from, for example, metal, plastic, or any other material having the requisite rigidity.

In at least one embodiment, as shown in FIG. 1, the piezoelectric fan 26 may be placed proximate to the integrated circuit 16 that presents the greatest heating problem. This may include, for example, a digital processing device, a wireless transceiver device, or some other device within the first compartment 12 that generates a high amount of heat. Multiple piezoelectric fans 26 may also be used within first sealed compartment 12. For example, a fan may be placed proximate to each of the highest heat producing circuits within the first compartment 12. In the illustrated embodiment, the piezoelectric fan 26 is mounted on a wall 24 of the wireless device 10. Additional fans may also be mounted on the wall 24 in various locations. In other embodiments, other locations may be used. Although not shown, in at least one embodiment, heat sink structures may be attached to one or more of the circuit components within the first compartment 12.

In addition to the first compartment 12, the wireless device 10 also includes a second compartment 14 that is located on an opposite side of the wall 24 from the first compartment 12. As shown, the second compartment 14 includes at least one piezoelectric fan 28 to provide air movement within the second compartment 14. The second compartment 14 is not sealed from the exterior environment like the first compartment 12. That is, the second compartment 14 has at least one opening 30 through which air can flow between the second compartment 14 and the exterior environment. During device operation, the air within the first compartment 12 will heat up from the various electronic elements therein. This increased air temperature will raise the temperature of the wall 24 between the first and second compartments 12, 14. The air movement within the second compartment 14 will act to cool the wall 24 via forced convection. Warmed air within the second compartment 14 will then flow out of the opening(s) 30 and into the surrounding environment. The net heat flow through the wall 24 and into the surrounding environment facilitates the cooling of the first compartment 12 and the electronic components located therein. In at least one embodiment of the invention, only the second compartment 14 of the wireless device 10 includes a piezoelectric fan (or fans) and not the first sealed compartment 12. In some embodiments, other compartments may be present within a wireless device 10 in addition to the first and second compartments 12, 14.

In the illustrated embodiment, the piezoelectric fan(s) 28 within the second compartment 14 is (are) mounted on the wall 24 that separates the first and second compartments 12, 14. Other mounting locations may also (or alternatively) be used. The wall 24 may be a single layer or a multi-layer structure. In at least one embodiment, electrical leads will extend through the wall 24 from the first compartment 12 to the second compartment 14 to provide an AC signal to power the fan(s) 28. The apertures though which the leads extend should be sealed. In other embodiments, a separate power source and signal generation unit may be placed within the second compartment 14 to power the fan(s) 28. Other techniques for powering the fan(s) 28 within the second compartment 14 may alternatively be used.

Because piezoelectric fans may be implemented in a relatively low profile manner, the inner dimensions of the second compartment 14 of the wireless device 10 may be made relatively small. For example, the internal dimension W of the second compartment 14, in a direction perpendicular to the plane of the wall 24 (see FIG. 1), may be less than 15 millimeters (mm) in some embodiments. In at least one embodiment, a dimension W of 4 mm is used. The dimension W will preferably allow for full displacement of the blade of the piezoelectric fari(s) 28 within the second compartment 14.

In the illustrated embodiment, the second compartment 14 has the same length L as the first compartment 12. In other embodiments, the lengths of the two compartments 12, 14 may be different. In at least one implementation, the second compartment 14 is shorter than the first compartment 12. For example, the second compartment 14 may only extend over a portion of the first compartment that is known to generate the most heat within the device 10. In the illustrated embodiment, the at least one opening 30 within the second compartment 14 is in a wall opposite the wall 24 between the first and second compartments 12, 14. In other embodiments, these openings may be in other locations (e.g., side walls, side walls and back wall, etc.). One of the purposes of the second compartment 14 is to provide physical protection to the piezoelectric fan(s) 28 disposed therein. In many cases, these fans may be relatively fragile structures that are easily damaged by external mechanical forces. The second compartment 14 forms a protective shell around the piezoelectric fan(s) 28 to protect the fan(s) from such forces. The outer walls of the second compartment 14 should have a rigidity adequate to protect the fan(s).

In one aspect of the present invention, an enclosure for a wireless device is provided. The enclosure may include, for example, a first compartment, a second compartment, and one or more piezoelectric fans mounted therein (such as the enclosure of the wireless device 10 of FIG. 1). The enclosure may be sold to, for example, a wireless device manufacturer which adds the electronics and/or other functionality to fabricate the completed wireless device. The first compartment of the enclosure may have an opening through which the circuitry may be installed. A seal may also be provided to seal up the first compartment after the circuitry has been added. Fan signal lines may also be provided within the enclosure to be attached to a signal source within the completed wireless device.

Figure 2:
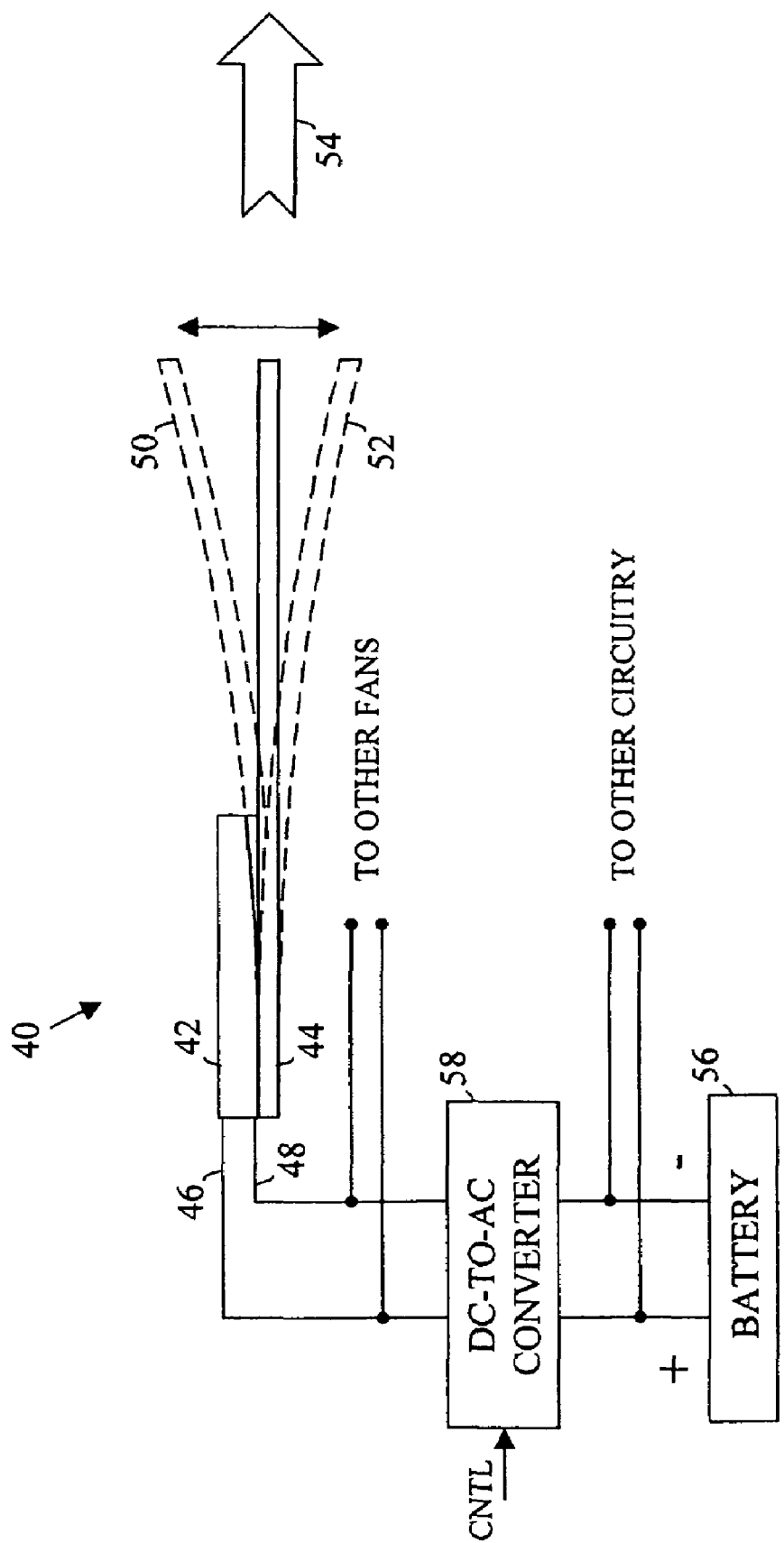
FIG. 2 is a block diagram illustrating an exemplary piezoelectric fan in accordance with an embodiment of the present invention.

FIG. 2 is a block diagram illustrating an exemplary piezoelectric fan 40 in accordance with an embodiment of the present invention. As shown, the piezoelectric fan 40 includes a piezoelectric element 42 having a blade 44 coupled thereto. When a voltage signal is applied across input terminals 46, 48 of the piezoelectric element 42, the element 42 deforms in a manner that depends upon a polarity of the applied signal. The temporarily deformed piezoelectric element 42 causes the blade 44 to move in a corresponding direction. For example, when a first voltage polarity is applied to the element 42, the element 42 may cause the blade 44 to move in an upward direction (i.e., toward position 50). When a second voltage polarity is applied to the element 42, the element 42 may cause the blade 44 to move in a downward direction (i.e., toward position 52). When the polarity of the signal applied to the input terminals 46, 48 of the piezoelectric element 42 is changed in a relatively periodic fashion, as with the application of an AC signal, the blade 44 will oscillate between up and down positions. This oscillatory action of the blade 44 will cause air to flow in an outward direction 54. Piezoelectric elements and/or fans may be purchased from various manufacturers including, for example, Piezo Systems Inc. of Cambridge, Mass., FujiKura America Inc. of Atlanta, Ga., and others.

In a typical wireless device, power may be supplied by a battery 56 within the device. In at least one embodiment of the present invention, a DC-to-AC converter 58 is used to convert the DC output of a local battery 56 to an AC signal for delivery to the piezoelectric fan 40. The battery 56 will also typically provide power to other circuitry within the corresponding wireless device. A single DC-to-AC converter 58 may be used to generate signals for all of the piezoelectric fans within a wireless device or multiple converters may be provided within a wireless device to support multiple fans. Other techniques for generating the fan input signals may alternatively be used.

In at least one embodiment of the invention, computer control of the various piezoelectric fans within a wireless device may be undertaken. For example, as shown in FIG. 2, a control signal may be applied to a DC-to-AC converter 58 to control variables such as, for example, an amplitude of the output AC signal, a frequency of the output AC signal, the shape of the output AC signal, etc. Control functionality may also be provided to energize only certain fans at a particular time when it is known that those fans will have the greatest impact on performance. For example, if one fan is located adjacent to a first IC and another fan is adjacent to a second IC, the fan adjacent to the second IC may be deactivated when it known that the second IC is not currently being used. In other embodiments, computer control of the fans is not used.

To reduce audible noise generated by the piezoelectric fans within a wireless device, the frequency of the signals applied to the fans may be kept at 150 Hertz (Hz) or below. The magnitude of the AC signal applied to the piezoelectric element 42 will typically depend upon the specific element being used. The voltage magnitudes often range between, for example, 1 and 100 volts. Any type of AC signal may be used including, for example, a sinusoidal wave, a square wave, a triangular wave, and/or others. As used herein, the term "AC signal" is intended to denote signals that vary with time and switch between positive and negative polarities. The term is not intended to imply that the signal must have a particular average amplitude level, a particular shape, or a constant frequency or magnitude (although an AC signal may have these qualities in accordance with the invention).

Figure 3:
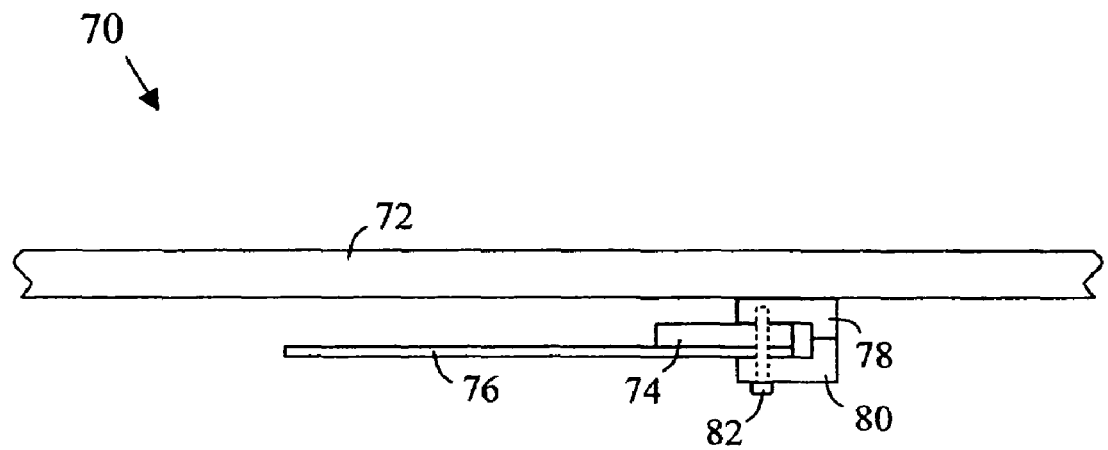
FIGS. 3 and 4 are a side view and a bottom view, respectively, of an arrangement for attaching a piezoelectric fan to a wall structure within a wireless device in accordance with an embodiment of the present invention.
Figure 4:
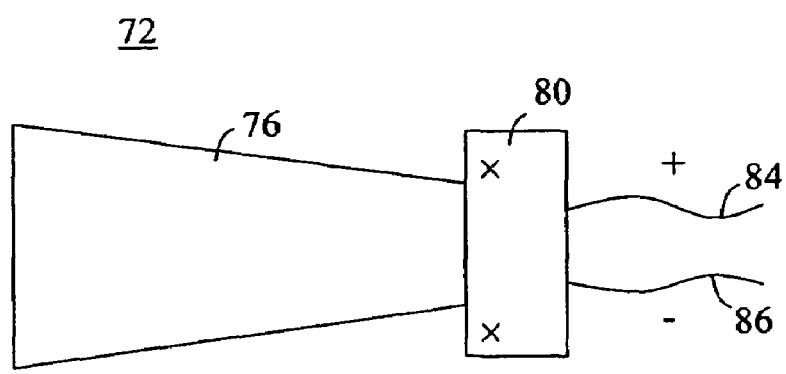

FIG. 3 is a side view illustrating an arrangement 70 for attaching a piezoelectric fan to a wall within a wireless device in accordance with an embodiment of the present invention. As shown, a piezoelectric element 74 has a blade 76 coupled thereto. The piezoelectric element/blade assembly 74, 76 is sandwiched between upper and lower portions 78, 80 of a fixture. One or more fasteners 82 (e.g., a screw, a clip, etc) are used to hold the upper and lower fixture portions 78, 80 together, thus holding the piezoelectric element/blade assembly 74, 76 in place. The upper portion 78 of the fixture is attached to the wall 72 of the wireless device. Any technique may be used to attach the fixture 78, 80 to the wall 72 including use of, for example, an adhesive, a fastener, or a weld. FIG. 4 is a bottom view of the arrangement 70 of FIG. 3. As shown, the blade 76 may increase in width as the distance from the element 74 increases. Any number of alternative blade shapes may be used. The shape of the blade 76 may be tailored to the specific region in which the fan is being implemented. First and second signal lines 84, 86 may be coupled to the piezoelectric element 74 to provide an AC signal to the element. In the illustrated embodiment, the first and second signal lines 84, 86 are inserted through a back portion of the fixture 78, 80. Other techniques for attaching a piezoelectric fan to a wall within a wireless device may alternatively be used.

Figure 5:
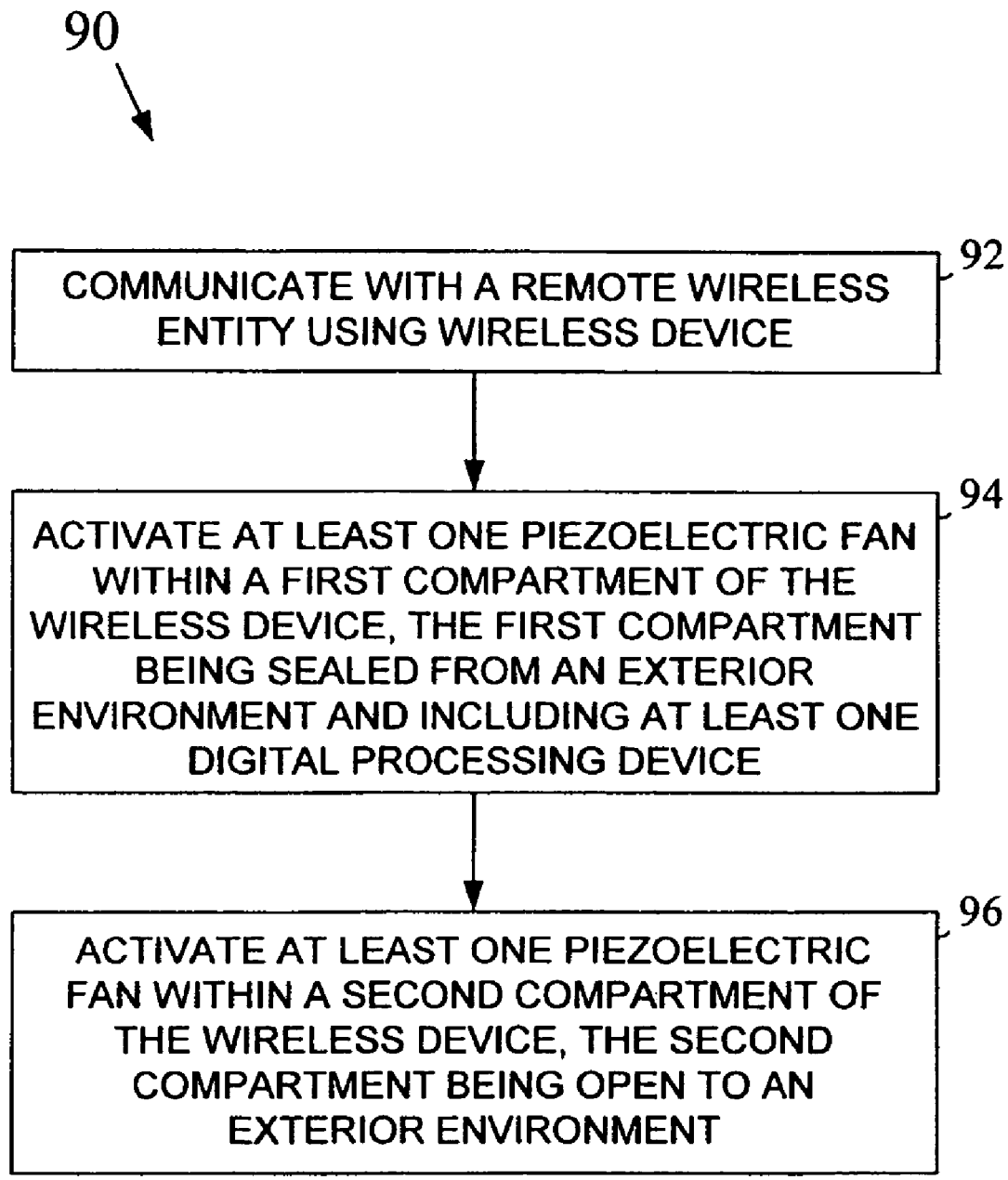
FIG. 5 is a flowchart illustrating a method for use in operating a wireless device in accordance with an embodiment of the present invention.

FIG. 5 is a flowchart illustrating a method 90 for use in operating a wireless device in accordance with an embodiment of the present invention. The wireless device is used to communicate with a remote wireless entity, such as another wireless device, a wireless access point, a base station, a communication satellite, and/or others (block 92). Operation of the wireless device causes the circuit elements within a first compartment of the device to heat up. At least one piezoelectric fan within the first compartment of the device is activated to provide cooling within the device (block 94). The first compartment of the wireless device includes some or all of the electronic circuitry of the device which may include, for example, a wireless transceiver device, a programmable or reconfigurable digital processing device, and/or other electronic elements. The first compartment is sealed from an exterior environment to protect the various circuit components therein from undesirable environmental factors that could harm the circuitry or effect the performance thereof. The at least one piezoelectric fan within the first compartment causes air to circulate within the first compartment to move heat away from circuit components therein and into an unoccupied inner space of the compartment. The piezoelectric fan(s) within the first compartment of the wireless device may be activated (a) automatically when the wireless device is powered on or when communication activities commence, (b) when a predetermined temperature is detected within the first compartment or elsewhere within the wireless device, or (c) when some other predetermined condition is detected.

At least one piezoelectric fan within a second compartment of the wireless device is also activated (block 96). The second compartment of the wireless device is on the opposite side of a wall from the first compartment of the device. The second compartment is open to an exterior environment outside the wireless device. The heat within the first compartment of the wireless device warms up the wall between the compartments. The at least one piezoelectric fan within the second compartment of the wireless device then moves heat away from the wall by forced convention. Warm air within the second compartment may then flow out into the exterior environment. The number and size of the fans within the first and second compartments of the wireless device may vary from implementation to implementation based on, for example, the type and power dissipation of the electronic components within the device, the size of the first and second compartments, the air moving capabilities of the individual fans, as well as other considerations. In at least one embodiment, only the second compartment of a wireless device includes a piezoelectric fan (or fans).

In the foregoing detailed description, various features of the invention are grouped together in one or more individual embodiments for the purpose of streamlining the disclosure. This method of disclosure is not to be interpreted as reflecting an intention that the claimed invention requires more features than are expressly recited in each claim. Rather, as the following claims reflect, inventive aspects may lie in less than all features of each disclosed embodiment.

Although the present invention has been described in conjunction with certain embodiments, it is to be understood that modifications and variations may be resorted to without departing from the spirit and scope of the invention as those skilled in the art readily understand. Such modifications and variations are considered to be within the purview and scope of the invention and the appended claims.

What is claimed is:

1. A wireless device comprising:
a first sealed compartment having electronic circuitry disposed therein, said first sealed compartment having a first wall; and
a second compartment, on an opposite side of said first wall from said first sealed compartment, that includes at least one piezoelectric fan to provide cooling for said first sealed compartment, said second compartment having at least one opening to allow air flow between said second compartment and an exterior environment, wherein said second compartment provides protection from physical damage for said at least one piezoelectric fan.

2. The wireless device of claim 1, wherein:
said at least one piezoelectric fan wiihin said second compartment includes one or more piezoelectric fans that are mounted on said first wall.

3. The wireless device of claim 1, wherein:
said second compartment has an internal dimension in a direction perpendicular to said first wall that is no greater than 15 millimeters.

4. The wireless device of claim 1, wherein:
said second compartment includes a second wall that is on an opposite side of said second compartment from said first wall, wherein said at least one opening includes one or more openings within said second wall.

5. The wireless device of claim 1, wherein:
said first sealed compartment includes at least one piezoelectric fan to produce air movement within said first sealed compartment.

6. The wireless device of claim 5, wherein:
said at least one piezoelectric fan within said first sealed compartment includes one or more piezoelectric fans that are mounted on said first wall.

7. The wireless device of claim 6, wherein:
said one or more piezoelectric fans within said first sealed compartment that are mounted on said first wall includes a first piezoelectric fan that is mounted in a location that is proximate to a digital processing device within said first sealed compartment.

8. The wireless device of claim 1, further comprising:
a battery; and
a DC-to-AC converter, coupled to said battery, to convert a DC voltage output by said battery to an AC signal to be applied to said at least one piezoelectric fan.

9. The wireless device of claim 8, wherein:
said AC signal to be applied to said at least one piezoelectric fan has a frequency that is no greater than 150 Hertz.

10. An enclosure for a wireless device, comprising:
a first compartment to house electronic circuitry in a region sealed from an exterior environment, said electronic circuitry to be used to support wireless communication, said first compartment including a first wall; and
a second compartment, on an opposite side of said first wall from said first compartment, that includes at least one piezoelectric fan to provide cooling for said first compartment, said second compartment having at least one opening to allow air flow between said second compartment and said exterior environment, wherein said second compartment provides protection from physical damage for said at least one piezoelectric fan.

11. The enclosure of claim 10, wherein:
said at least one piezoelectric fan within said second compartment includes one or more piezoelectric fans that are mounted on said first wall.

12. The enclosure of claim 10, wherein:
said second compartment has an internal dimension in a direction perpendicular to said first wall that is no greater than 15 millimeters.

13. The enclosure of claim 10, wherein:
said second compartment includes a second wall that is on an opposite side of said second compartment from said first wall, wherein said at least one opening includes one or more openings within said second wall.

14. The enclosure of claim 10, wherein:
said first compartment includes at least one piezoelectric fan to produce air movement within said first compartment.

15. The enclosure of claim 14, wherein:
said at least one piezoelectric fan within said first compartment includes one or more piezoelectric fans that are mounted on said first wall.

16. A method comprising:
using a wireless device to communicate with a remote wireless entity, said wireless device including electronic circuitry within a first sealed compartment thereof; and
activating at least one piezoelectric fan within a second compartment of said wireless device to cool said first sealed compartment of said wireless device, said second compartment having at least one opening to provide air flow between said second compartment and an exterior environment.

17. The method of claim 16, wherein:
activating at least one piezoelectric fan includes generating an alternating current (AC) signal and delivering said AC signal to said at least one piezoelectric fan.

18. The method of claim 16, wherein:
delivering said AC signal to said at least one piezoelectric fan includes feeding said AC signal into said second compartment from said first compartment.

19. The method of claim 16, further comprising:
activating at least one piezoelectric fan within said first sealed compartment of said wireless device to produce air movement within said first sealed compartment, said air movement to cool at least one electronic component within said first sealed compartment by forced convection.

* * * * *